United States Patent
Nagase et al.

(10) Patent No.: US 11,540,390 B2
(45) Date of Patent: Dec. 27, 2022

(54) PRINTED WIRING BOARD AND METHOD OF MANUFACTURING PRINTED WIRING BOARD

(71) Applicant: KYOCERA Corporation, Kyoto (JP)

(72) Inventors: Tomoya Nagase, Kurobe (JP); Shinri Saeki, Shimoniikawa-gun (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 17/263,187

(22) PCT Filed: Jul. 29, 2019

(86) PCT No.: PCT/JP2019/029584
§ 371 (c)(1),
(2) Date: Jan. 26, 2021

(87) PCT Pub. No.: WO2020/027022
PCT Pub. Date: Feb. 6, 2020

(65) Prior Publication Data
US 2021/0185812 A1  Jun. 17, 2021

(30) Foreign Application Priority Data
Jul. 31, 2018 (JP) .............................. JP2018-143120

(51) Int. Cl.
*H05K 1/11* (2006.01)
*H05K 1/03* (2006.01)
(Continued)

(52) U.S. Cl.
CPC ............. *H05K 1/115* (2013.01); *H05K 1/034* (2013.01); *H05K 3/4069* (2013.01); *H05K 3/4611* (2013.01)

(58) Field of Classification Search
CPC ........ H05K 1/115; H05K 1/034; H05K 1/036; H05K 1/116; H05K 1/0298; H05K 1/0353;
(Continued)

(56) References Cited

U.S. PATENT DOCUMENTS 5,308,929 A * 5/1994 Tani .................. H01L 21/486
174/262
2006/0223307 A1* 10/2006 Gotoh .................. B23K 26/382
438/640

(Continued)

FOREIGN PATENT DOCUMENTS

JP 2008-235624 A 10/2008
JP 2011-035182 A 2/2011
(Continued)

*Primary Examiner* — Hoa C Nguyen
*Assistant Examiner* — John B Freal
(74) *Attorney, Agent, or Firm* — Volpe Koenig

(57) ABSTRACT

Forming, in a printed-wiring board, a via sufficiently filled without residual smear, for use in an insulating layer and the size of the via to be formed. A via of a printed-wiring board comprises a first filling portion which fills at least a center portion of a hole, and a second filling portion which fills a region of the hole that is not filled with the first filling portion. An interface which exists between the second and first filling portions, or an interface which exists between the second filling portion and an insulating layer and the first filling portion has the shape of a truncated cone comprising a tapered surface which is inclined to become thinner from a first surface toward a second surface, and an upper base surface which is positioned in parallel to the second surface and closer to the first surface than to the second surface.

8 Claims, 7 Drawing Sheets

(51) Int. Cl.
*H05K 3/40* (2006.01)
*H05K 3/46* (2006.01)

(58) Field of Classification Search
CPC ........ H05K 1/0366; H05K 1/038; H05K 1/11;
H05K 1/111; H05K 1/112; H05K 1/113;
H05K 1/144; H05K 2201/09563; H05K
2201/09509; H05K 2201/09827; H05K
2201/09454; H05K 3/4069; H05K
3/4611; H05K 3/4635; H05K 3/002;
H05K 3/0035; H05K 3/0055; H05K
2203/0723; H05K 2203/1563; H05K
2203/1554; H06K 2201/015
See application file for complete search history.

(56) References Cited

U.S. PATENT DOCUMENTS

| | | | |
|---|---|---|---|
| 2008/0053688 A1* | 3/2008 | Park | H05K 3/4602 174/250 |
| 2009/0148594 A1* | 6/2009 | Moran | H01L 23/49811 427/105 |
| 2009/0272564 A1* | 11/2009 | Yoshioka | H05K 3/184 29/846 |
| 2010/0243311 A1* | 9/2010 | Niki | H05K 3/422 174/266 |
| 2011/0155441 A1* | 6/2011 | Tseng | H05K 3/465 216/13 |
| 2012/0292083 A1 | 11/2012 | Yoshioka et al. | |
| 2014/0166355 A1 | 6/2014 | Hong et al. | |
| 2017/0327630 A1 | 11/2017 | Kiya et al. | |
| 2020/0137892 A1* | 4/2020 | Ling | H05K 3/422 |
| 2020/0251351 A1* | 8/2020 | Ifis | H01L 21/486 |

FOREIGN PATENT DOCUMENTS

| | | |
|---|---|---|
| JP | 2014-154631 A | 8/2014 |
| JP | 2015-198128 A | 11/2015 |
| JP | 2017-107934 A | 6/2017 |

\* cited by examiner

PRINTED WIRING BOARD AND METHOD OF MANUFACTURING PRINTED WIRING BOARD

TECHNICAL FIELD

The present disclosure relates to a printed wiring board and a method of manufacturing a printed wiring board.

BACKGROUND ART

To manufacture a printed wiring board in which substrates are superposed, as a via(s) for electrically connecting wirings of the layers, a filled via(s) may be formed.

A method of manufacturing a printed wiring board having a filled via(s) is proposed, for example, in Patent Literature 1.

Details thereof are as follows.

First, a resin layer is formed on the surface of a tentative substrate separably. Next, a via drill hole is formed in the resin layer by laser beam machining. Next, a seed layer is formed on the surface of the resin layer and the inner surface of the via drill hole in a state in which smear (resin residue) is left in the via drill hole. Next, a wiring layer is formed in the via drill hole by electrolytic plating. Next, the resin layer is separated from the tentative substrate, and the smear exposed on a surface of the resin layer, the surface having been in contact with the tentative substrate, is removed.

CITATION LIST

Patent Literature

Patent Literature 1: JP 2011-035182 A

SUMMARY OF INVENTION

A printed wiring board of the present disclosure is a printed wiring board including: a substrate including a planar insulating layer having a through hole in a thickness direction; and a via being the hole filled with a conductive material.

The via has a first filled portion that is at least a central portion in the hole filled with the conductive material and a second filled portion that is a region in the hole not filled by the first filled portion, the region being filled with the conductive material.

An interface existing between the second filled portion and the first filled portion or an interface existing between (i) the second filled portion and the insulating layer and (ii) the first filled portion has a shape of a conical frustum having: a conical surface that is inclined so as to taper from a first surface present at one end in the thickness direction of the insulating layer toward a second surface being an opposite surface to the first surface of the insulating layer; and an upper base surface that is parallel to the second surface and is located toward the first surface from the second surface.

A method of manufacturing a printed wiring board of the present disclosure is a method of manufacturing a printed wiring board using a copper-clad laminate including an insulating layer formed in a shape of a plate.

This method includes a hole forming step, a first filling step, a bottom wall removing step and a second filling step.

The hole forming step includes forming, in a first surface present at one end in a thickness direction of the insulating layer, a bottomed hole in a shape of a conical frustum having: a conical surface that is inclined so as to taper from the first surface toward a second surface being an opposite surface to the first surface of the insulating layer; and an upper base surface that is parallel to the second surface and is located toward the first surface from the second surface.

The first filling step includes filling the hole with a conductive material, thereby forming a first filled portion.

The bottom wall removing step includes removing, on a second surface side on which the second surface is present, at least a bottom wall of the hole, thereby exposing the conductive material.

The second filling step includes filling, with a conductive material, a space formed after the bottom wall is removed, thereby forming a via.

DESCRIPTION OF EMBODIMENTS

Figure 1:
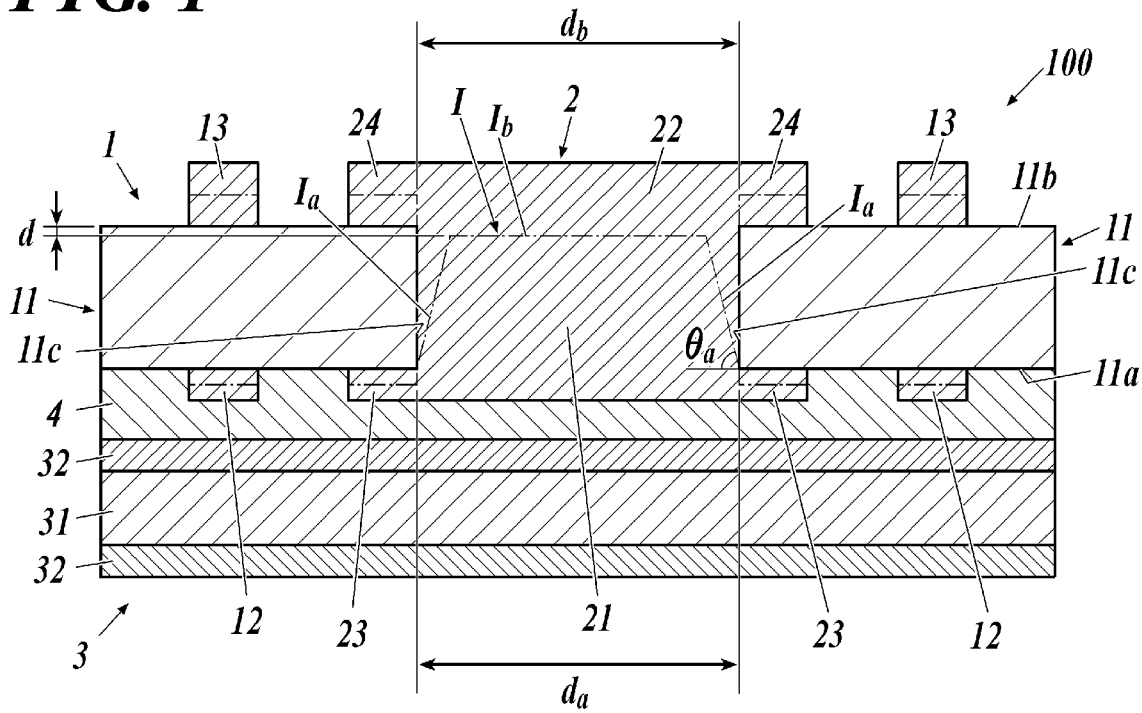
FIG. 1 is a sectional view of a printed wiring board according to an embodiment of the present disclosure.

One of printed wiring boards is a printed wiring board for communication including an antenna substrate where a wiring is formed, the wiring functioning as an antenna for transmitting and receiving radio waves.

In such a printed wiring board for communication, in order to suppress increase in transmission loss due to increase in frequency of radio waves, an insulating layer of the antenna substrate is made of a material having a low permittivity, such as polytetrafluoroethylene (hereinafter "PTFE"), in an increasing number of cases.

When a printed wiring board for communication is manufactured, as compared with printed wiring boards for other purposes, a via(s) having a large diameter or a via(s) that reaches a deep point in an insulating layer is often formed.

However, in the conventional method of manufacturing a printed wiring board, desmearing is performed on the inner surface of the via drill hole and on the resin layer with the tentative substrate separated.

As general desmearing, a wet process using an aqueous solution of permanganic acid is mainly used. However, the abovementioned PTFE used as the insulating layer of the antenna substrate has a high water absorption. Hence, when desmearing using an aqueous solution of permanganic acid is performed on the insulating layer made of PTFE, the insulating layer absorbs water contained in the aqueous solution of permanganic acid, and the insulating layer may expand while or after the printed wiring board is manufactured.

That is, the conventional method of manufacturing a printed wiring board may be difficult to use depending on the material of the insulating layer on which desmearing is performed.

In the conventional method of manufacturing a printed wiring board, if a laser beam for forming the via drill hole is made strong and thereby can completely remove the smear, the abovementioned problems in desmearing can be solved.

However, in practice, if the laser beam is made too strong, it does not only remove the smear completely but also may damage copper foil that is present deeper than the smear. Hence, this method is not practical.

In the conventional method of manufacturing a printed wiring board, when PTFE is not used as the insulating layer, desmearing and the subsequent soft etching on the inner surface of the via drill hole and so forth can wash away the smear that has not been removed by desmearing, together with the outer layer portion of copper foil.

However, in the case of the abovementioned via drill hole that is deeper than the conventional one, the via drill hole being often found in a printed wiring board for communication, a soft-etching solution is difficult to go deep into the via drill hole, and may not remove smear sufficiently.

Further, in electrolytic filling plating that is performed to form a filled via(s), plating is first deposited on the bottom of a via drill hole, and deposited on the outer layer of an insulating layer after the via drill hole is filled.

However, in the case of the abovementioned via drill hole having a diameter larger than the conventional one, the via drill hole being often found in a printed wiring board for communication, plating starts to be deposited on the outer layer of an insulating layer before the via drill hole is completely filled, so that the via drill hole may be filled insufficiently.

That is, the conventional method of manufacturing a printed wiring board may be difficult to use depending on the diameter or the depth of a via to be formed.

According to a printed wiring board(s) of the present disclosure, even when constraints are imposed on at least one of the material used for an insulating layer and the diameter or the depth of a via to be formed, a via in which smear is not left and that is filled sufficiently can be formed.

Hereinafter, embodiments of the present disclosure will be described in detail with reference to the drawings.

[Configuration of Printed Wiring Board]

First, a configuration of a printed wiring board according to an embodiment will be described. FIG. 1 is a sectional view of a printed wiring board 100 according to this embodiment.

As shown in FIG. 1, the printed wiring board 100 according to this embodiment includes a first substrate 1, a via 2, a second substrate 3 and an insulating layer 4.

In this embodiment, the first substrate 1 (substrate) is superposed at an extreme end of the printed wiring board 100.

The first substrate 1 includes a first insulating layer 11, a first wiring 12 and a second wiring 13.

The first insulating layer 11 according to this embodiment is formed of a material (e.g. glass fiber and polytetrafluoroethylene, which is hereinafter "PTFE") different from a material constituting a second insulating layer 31 of the second substrate 3, which is described later, in the shape of a plate.

As the material constituting the first insulating layer 11, other than PTFE, fluororesin may be used. Further, a resin other than fluororesin may be used.

Hereinafter, a surface present at one end in the thickness direction of the first insulating layer 11 (surface on the lower side in FIG. 1) is referred to as a first surface 11a, and a surface (surface on the upper side in FIG. 1) being the opposite surface to the first surface 11a of the first insulating layer 11 is referred to as a second surface 11b.

The first insulating layer 11 has a via drill hole 11c.

The via drill hole 11c (hole) passes through the first insulating layer 11 in the thickness direction of the first insulating layer 11.

The via drill hole 11c viewed from a direction perpendicular to the first surface 11a or the second surface 11b is circular.

The via drill hole 11c in this embodiment has a diameter $d_a$ on the first surface 11a side and a diameter $d_b$ on the second surface 11b side that are equal.

The inner surface of the via drill hole 11c in this embodiment is perpendicular to the first surface 11a or the second surface 11b.

The via drill hole 11c may have the diameter $d_a$ on the first surface 11a side smaller than the diameter $d_b$ on the second surface 11b side, or may have the diameter $d_a$ on the first surface 11a side larger than the diameter $d_b$ on the second surface 11b side. These cases (other embodiments) are described later.

The first wiring 12 is formed of a conductive material (e.g. copper) on the first surface 11a of the first insulating layer 11.

The second wiring 13 is formed of a conductive material (e.g. copper) on the second surface 11b of the first insulating layer 11.

At least one of the first wiring 12 and the second wiring 13 according to this embodiment is shaped to function as an antenna for transmitting and receiving radio waves.

The via 2 is a filled via that is the via drill hole 11c filled with a conductive material (e.g. copper).

The via 2 electrically connects the first and second wirings 12, 13 of the first substrate 1 and the second substrate 3, which is described later.

The via 2 has a first filled portion 21 and a second filled portion 22.

The via 2 according to this embodiment also has a first land 23 and a second land 24.

The first filled portion 21 is at least a central portion in the via drill hole 11c filled with a conductive material (e.g. copper).

The first filled portion 21 according to this embodiment not only fills the inside of the via drill hole 11c, but also partly protrudes from the first surface 11a to the outside of the via drill hole 11c.

The second filled portion 22 is a region in the via drill hole 11c not filled by the first filled portion 21, the region being filled with a conductive material (e.g. copper).

The second filled portion 22 according to this embodiment not only fills the inside of the via drill hole 11c, but also partly protrudes from the second surface 11b to the outside of the via drill hole 11c.

The first land 23 is made of a conductive material (e.g. copper) and provided around the via drill hole 11c on the first surface 11a so as to be united with the first filled portion 21.

The first land 23 electrically connects with the first wiring 12 of the first substrate 1.

The second land 24 is made of a conductive material (e.g. copper) and provided around the via drill hole 11c on the second surface 11b so as to be united with the second filled portion 22.

The second land 24 electrically connects with the second wiring 13 of the first substrate 1.

The first filled portion 21 and the second filled portion 22 are united in the via drill hole 11c. However, between the second filled portion 22 and the first filled portion 21, an interface I as indicated by a chain line in FIG. 1 exists.

The interface I has a conical surface $I_a$ and an upper base surface $I_b$.

The conical surface $I_a$ is inclined at a predetermined angle $\theta_a$ with respect to the first surface 11a so as to taper from the first surface 11a toward the second surface 11b.

The upper base surface $I_b$ is parallel to the second surface 11b and is a predetermined distance d away from the second surface 11b toward the first surface 11a.

The interface I has a shape of a conical frustum having the conical surface $I_a$ and the upper base surface $I_b$.

The distance d between the second surface 11b and the upper base surface $I_b$ is a length not exceeding half the thickness of the first insulating layer 11.

The second substrate 3 is superposed on the first surface 11a of the first substrate 1 with the insulating layer 4 in between.

The second substrate 3 includes the second insulating layer 31 and third wirings 32.

The second insulating layer 31 and the insulating layer 4 are each made of an insulating material (e.g. glass woven fabric and epoxy resin) and have a shape of a plate.

The third wirings 32 are each formed of a conductive material (e.g. copper) on a surface of the second insulating layer 31.

FIG. 1 shows, as an example of the second substrate 3, a two-layer substrate in which the third wirings 32 are superposed on the respective sides (surfaces) of the one second insulating layer 31. The second substrate 3 may be a multilayer substrate in which the second insulating layers 31 and the third wirings 32 are superposed alternately.

[Method of Manufacturing Printed Wiring Board]

Next, a method of manufacturing the printed wiring board 100 will be described. FIG. 2A, FIG. 2B, FIG. 2C and FIG. 2D are sectional views showing steps of the first half in manufacturing the printed wiring board 100. FIG. 3A, FIG. 3B, FIG. 3C, FIG. 3D, FIG. 3E and FIG. 3F are sectional views showing steps of the second half in manufacturing the printed wiring board 100.

The method of manufacturing the printed wiring board 100 according to this embodiment has a hole forming step, a first filling step, a substrate superposing step, an opening forming step, a bottom wall removing step, a second filling step and a circuit forming step.

Before the hole forming step, a copper-clad laminate 1A is prepared. The copper-clad laminate 1A is a member that becomes the first substrate 1 later.

Figure 2A:
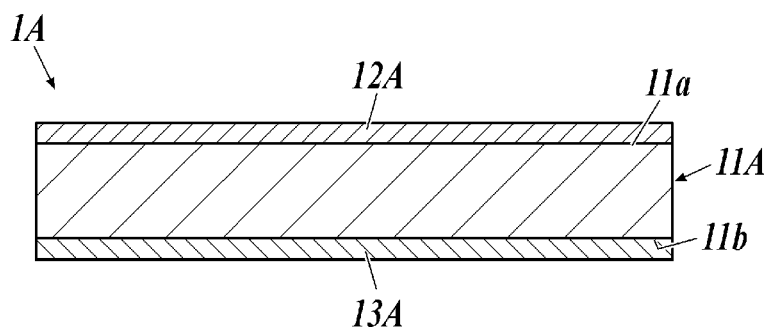
FIG. 2A shows one of steps of the first half in manufacturing the printed wiring board shown in FIG. 1.

The copper-clad laminate 1A to be used includes, as shown in FIG. 2A, an insulating layer 11A, a first copper foil layer 12A formed on the entire first surface 11a that is present at one end in the thickness direction of the insulating layer 11A, and a second copper foil layer 13A formed on the entire second surface 11b that is the opposite surface to the first surface 11a of the insulating layer 11A.

Figure 2B:
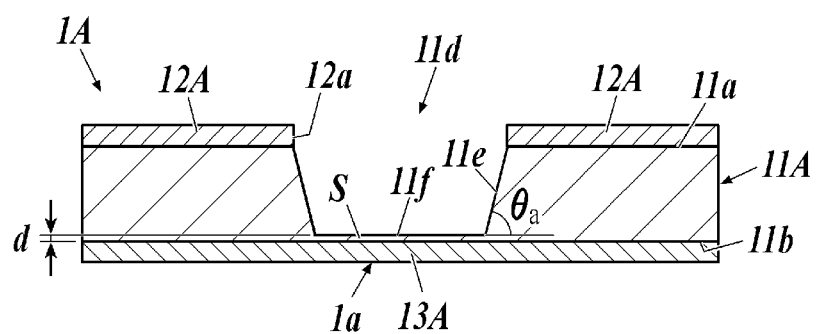
FIG. 2B shows one of the steps of the first half in manufacturing the printed wiring board shown in FIG. 1.

In the hole forming step, which is performed first, as shown in FIG. 2B, a bottomed via drill hole 11d is formed in the first surface 11a of the insulating layer 11A.

The via drill hole 11d is formed by laser beam machining, for example.

Various methods are usable to form the via drill hole 11d. For example, one of these is a method of: forming a first opening 12a by subtractive etching or the like, on the first copper foil layer 12A, at a point where the via 2 is to be formed; and performing laser beam machining on a portion of the insulating layer 11A exposed from the first opening 12a. Another one of these is a method of directly performing laser beam machining, of the first copper foil layer 12A, on the point where the via 2 is to be formed, without forming the first opening 12a in advance.

When laser beam machining is performed, laser irradiation is adjusted such that the shape of the via drill hole 11d is the shape of the later-formed first filled portion 21.

More specifically, laser irradiation is adjusted such that the via drill hole 11d has a shape of a conical frustum having: a conical surface 11e that is inclined at the predetermined angle $\theta_a$ so as to taper from the edge of the first opening 12a on the first surface 11a toward the second surface 11b; and an upper base surface 11f that is parallel to the second surface 11b and is located a predetermined distance d away from the second surface 11b toward the first surface 11a.

Hereinafter, a portion of the copper-clad laminate 1A forming the upper base surface 11f of the via drill hole 11d is referred to as a bottom wall 1a.

The bottom wall 1a at this stage includes the second copper foil layer 13A and smear S remaining on the surface of the second copper foil layer 13A.

Depending on the depth of the via drill hole 11d to be formed, the insulating layer 11A remaining thin on the bottom wall 1a by not being scraped with a laser beam is the smear S.

That is, in the hole forming step, the smear S may be left on the inner surface of the formed via drill hole 11d.

Desmearing may be performed on the inner surface of the via drill hole 11d. As desmearing that is performed at this stage, a dry method, such as $O_2$ plasma processing, is used.

Further, soft etching may be performed on the inner surface of the via drill hole 11d to wash away the smear S that has not been removed by desmearing.

However, depending on the shape of the formed via drill hole 11d, the effect of soft etching may not be obtained sufficiently, and consequently the smear S may not be removed completely at this stage.

Figure 2C:
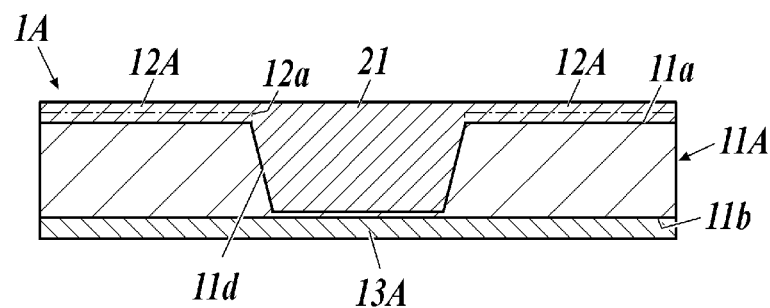
FIG. 2C shows one of the steps of the first half in manufacturing the printed wiring board shown in FIG. 1.

After the via drill hole 11d is formed, the process proceeds to the first filling step. In this step, as shown in FIG. 2C, by electrolytic filling plating, a space in the via drill hole 11d and a space in the first opening 12a are filled with a conductive material (e.g. copper).

The conductive material that fills the via drill hole 11d and the first opening 12a forms the first filled portion 21 of the via 2.

In addition, the first wiring 12 is formed.

The first wiring 12 may be formed by using a subtractive method after the via drill hole 11d is filled, or may be formed by using MSAP (Modified Semi Additive Process) in parallel with the filling of the via drill hole 11d.

Figure 2D:
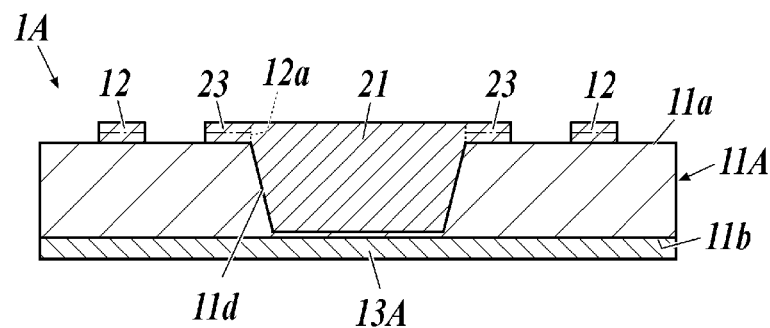
FIG. 2D shows one of the steps of the first half in manufacturing the printed wiring board shown in FIG. 1.

When the first wiring 12 is formed, as shown in FIG. 2D, the first land 23 of the via 2 is formed from the first copper foil layer 12A.

Figure 3A:
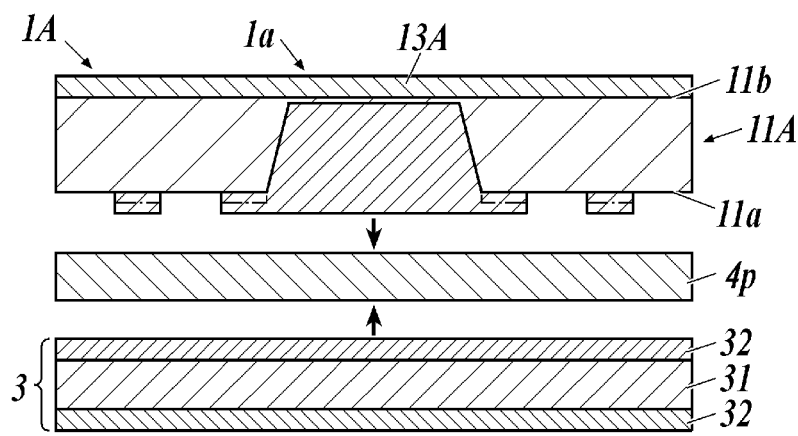
FIG. 3A shows one of steps of the second half in manufacturing the printed wiring board shown in FIG. 1.
Figure 3B:
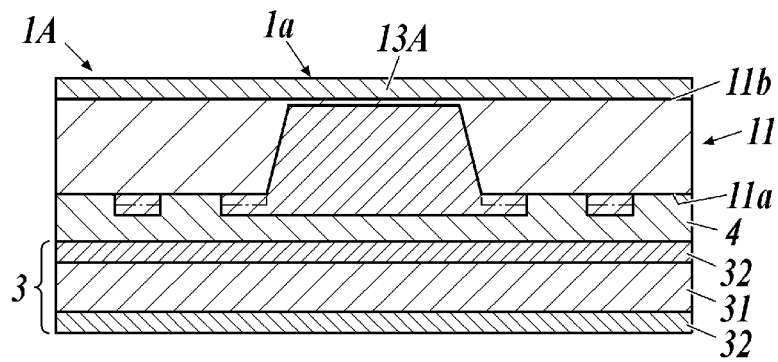
FIG. 3B shows one of the steps of the second half in manufacturing the printed wiring board shown in FIG. 1.

After the via drill hole 11d is filled, the process proceeds to the substrate superposing step. In this step, as shown in FIG. 3A and FIG. 3B, the second substrate 3 is superposed on the first surface 11a of the copper-clad laminate LA, the first surface 11a side of which has been processed, with prepreg 4p, which is a semi-cured insulating material, in between.

By the superposing being performed, the insulating layer 11A of the copper-clad laminate 1A becomes the first insulating layer 11.

By being cured, the prepreg 4p becomes the insulating layer 4 that is on the first substrate 1 side and adjacent to the second substrate 3.

Figure 3C:
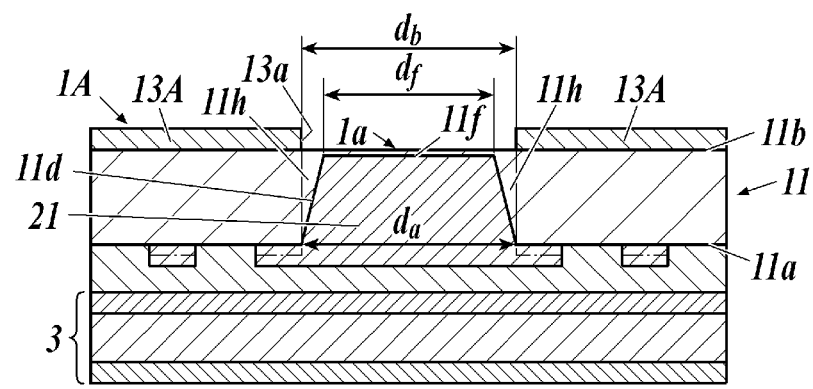
FIG. 3C shows one of the steps of the second half in manufacturing the printed wiring board shown in FIG. 1.

After the second substrate 3 is superposed on the copper-clad laminate LA, the process proceeds to the opening forming step. In this step, as shown in FIG. 3C, a second opening 13a is formed, on the second copper foil layer 13A of the copper-clad laminate LA, at a point where the via 2 is to be formed. In this embodiment, the diameter of the second opening 13a (equal to the diameter $d_b$ of the later-formed via drill hole 11c on the second surface 11b side) is equal to the diameter $d_a$ of the via drill hole 11d, which has been formed in the hole forming step, on the first surface 11a side.

The second opening 13a is formed by subtractive etching, for example.

After the second opening 13a is formed, the process proceeds to the bottom wall removing step. In this step, on the second surface 11b side of the copper-clad laminate LA, at least the bottom wall 1a of the via drill hole 11d is removed.

In this embodiment, the diameter $d_b$ of the second opening 13a is larger than the diameter $d_f$ of the upper base surface 11f of the via drill hole 11d. Hence, in addition to the bottom wall 1a of the via drill hole 11d, a side wall 11h that is a portion of the first insulating layer 11 forming the conical surface 11e of the via drill hole 11d is also removed by being cut off at a plane that passes through the edge of the second opening 13a and is perpendicular to the second surface 11b.

The bottom wall 1a and the side wall 11h are removed by laser beam machining, for example.

Figure 3D:
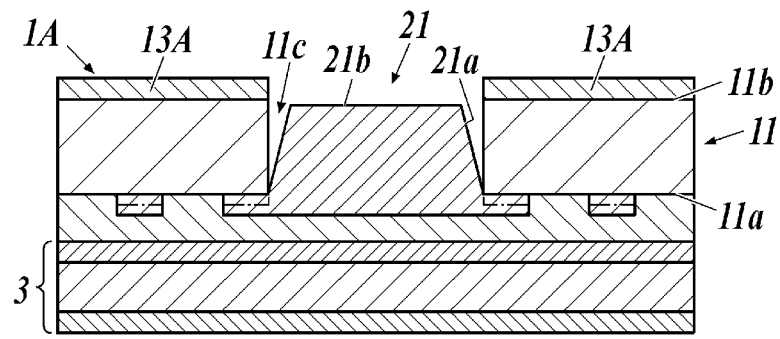
FIG. 3D shows one of the steps of the second half in manufacturing the printed wiring board shown in FIG. 1.

When the bottom wall 1a and the side wall 11h are removed, as shown in FIG. 3D, an upper base surface 21b of the first filled portion 21 and a conical surface 21a of the first filled portion 21 are exposed entirely.

When the bottom wall 1a and the side wall 11h are removed, the via drill hole 11d passes through the first insulating layer 11 and becomes the via drill hole 11c.

Then, desmearing is performed on the inner surface of the via drill hole 11c to remove the smear S that remains on the inner surface of the via drill hole 11c and on the surface of the first filled portion 21 after the bottom wall 1a and the side wall 11h are removed.

As desmearing that is performed at this stage too, a dry method, such as $O_2$ plasma processing, is used.

Further, soft etching is performed on the inner surface of the via drill hole 11c to wash away the smear S that has not been removed by desmearing.

Consequently, those including the smear S forming the bottom wall 1a of the via drill hole 11d are removed completely.

Figure 3E:
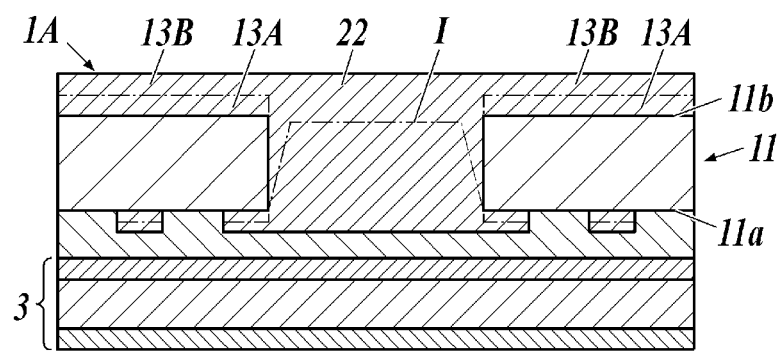
FIG. 3E shows one of the steps of the second half in manufacturing the printed wiring board shown in FIG. 1.

After the bottom wall 1a of the via drill hole 11d is removed, the process proceeds to the second filling step. In this step, as shown in FIG. 3E, by electrolytic filling plating, a space formed after the bottom wall 1a of the via drill hole 11d is removed is filled with a conductive material (e.g. copper), and also a plating layer 13B is formed on the surface of the second copper foil layer 13A.

The conductive material that fills the space forms the second filled portion 22 of the via 2.

When the second filled portion 22 is formed, the frusto-conical interface I is formed by the second filled portion 22 and the first filled portion 21.

After the conductive material filling, the process proceeds to the circuit forming step. In this step, etching resists are formed on the surface of the second filled portion 22 and the surface of a portion of the plating layer 13B, the portion becoming the second wiring 13 later, and etching is performed.

Figure 3F:
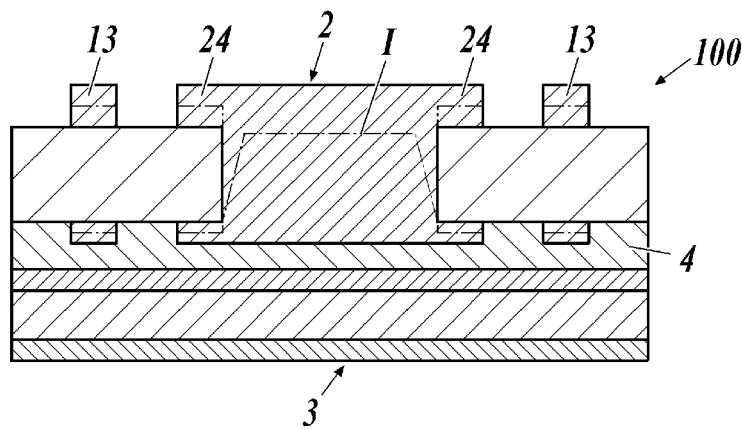
FIG. 3F shows one of the steps of the second half in manufacturing the printed wiring board shown in FIG. 1.

When etching is performed, as shown in FIG. 3F, unnecessary portions are removed from the plating layer 13B and the second copper foil layer 13A, and consequently the second land 24 of the via 2 and the second wiring 13 are formed.

As described above, the printed wiring board 100 according to this embodiment is obtained by forming the frusto-conical via drill hole 11d in the insulating layer 11A, forming the first filled portion 21, removing the bottom wall 1a of the via drill hole 11d, completely removing the smear S that remains in the end, and then forming the second filled portion 22.

Hence, even when constraints are imposed on at least one of the material used for the first insulating layer 11 and the size (diameter and/or depth) of the via 2 to be formed, a via in which the smear S is not left and that is filled sufficiently can be formed in the printed wiring board 100.

Further, although PTFE, which is the material of the first insulating layer 11 of this embodiment, is a material having a low processability, it can be easily processed by using the manufacturing method of this embodiment.

Further, although PTFE has water absorbency, using a dry method as desmearing can prevent the insulating layer 11A formed of PTFE from expanding.

Further, even when the via drill hole 11d has a large diameter or is deep, the via drill hole 11d is easily filled.

Further, an abnormality of the via 2 being filled insufficiently can be reduced.

Further, even when the via drill hole 11d has a large diameter or is deep, the smear S remaining on the upper base surface 11f of the via drill hole 11d can be easily removed.

Further, the diameter of the second filled portion 22 of the via 2 (equal to the diameter $d_b$ of the via drill hole 11c on the second surface 11b side), the second filled portion 22 being liable to be stressed, not being small can enhance reliability of conduction performance of the via 2.

Further, the diameter $d_b$ of the second filled portion 22 of the via 2 being equal to the diameter of the first opening 12a (equal to the diameter $d_a$ of the via drill hole 11d on the first surface 11a) makes it easy to control the diameter of the via 2 on the second surface 11b side, the diameter including the diameter $d_b$ of the second filled portion 22.

Another Embodiment 1

In the above embodiment, as an example, the printed wiring board 100 is described, in which the diameter $d_a$ of the via drill hole 11c on the first surface 11a side and the diameter $d_b$ thereof on the second surface 11b side are equal, and the inner surface of the via drill hole 11c is perpendicular to the first surface 11a or the second surface 11b. There may be another embodiment in which the diameter $d_a$ of the via drill hole 11c on the first surface 11a side and the diameter $d_b$ thereof on the second surface 11b side are equal, and the inner surface of the via drill hole 11c is inclined with respect to the first surface 11a.

Figure 4A:
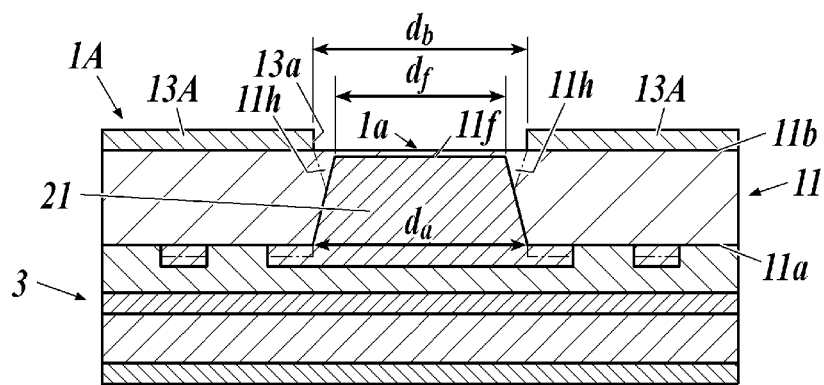
FIG. 4A shows one of steps of the second half in manufacturing a printed wiring board according to another embodiment 1.

A method of manufacturing such a printed wiring board 100A is, as shown in FIG. 4A, the same as that of the above embodiment to the opening forming step (shown in FIG. 3C).

As with the above embodiment, in another embodiment 1 too, the diameter $d_b$ of the second opening 13a is larger than the diameter $d_f$ of the upper base surface 11f of the via drill hole 11d. Hence, in the subsequent bottom wall removing step, part of the side wall 11h is removed in addition to the bottom wall 1a.

Figure 4B:
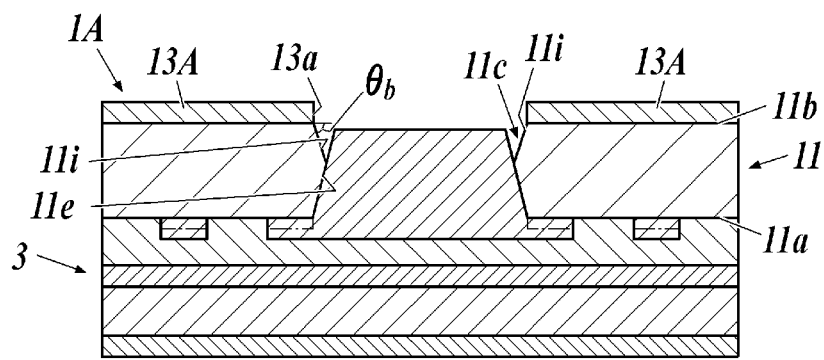
FIG. 4B shows one of the steps of the second half in manufacturing the printed wiring board according to the embodiment 1.

However, in this embodiment, as shown in FIG. 4B, laser irradiation is adjusted such that the cut surface of a portion to be removed becomes a conical surface 11i that tapers from the edge of the second opening 13a on the second surface 11b toward the first surface 11a and is inclined at a predetermined angle $\theta_b$ with respect to the second surface 11b. The angle $\theta_b$ may be the same as or different from the angle $\theta_a$ of the conical surface 11e for forming the via drill hole 11d from the first surface 11a side.

When the bottom wall 1a and part of the side wall 11h of the via drill hole 11d are removed, the via drill hole 11d passes through the first insulating layer 11 and becomes the via drill hole 11c.

At the time, the conical surface 11e of the via drill hole 11d formed from the first surface 11a side and the conical surface 11i formed by removal of part of the side wall 11h intersect at a middle portion in the thickness direction of the first insulating layer 11.

That is, the shape of the via drill hole 11c is the shape in which the upper base surfaces of the conical frustums face one another at the middle portion in the thickness direction of the first insulating layer 11 (in which the via drill hole c narrows at the middle portion).

Figure 4C:
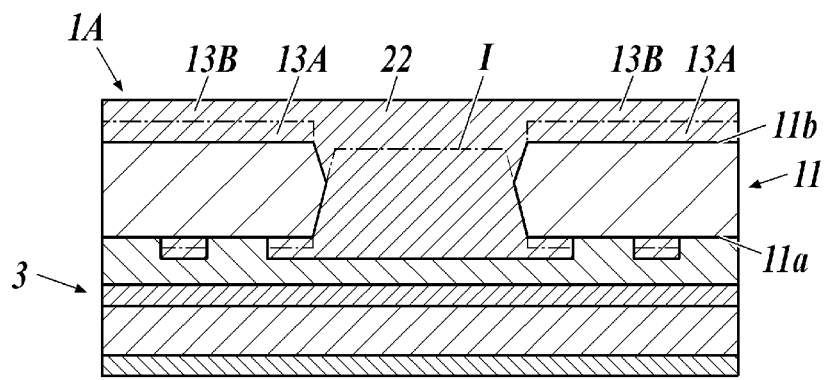
FIG. 4C shows one of the steps of the second half in manufacturing the printed wiring board according to the embodiment 1.
Figure 4D:
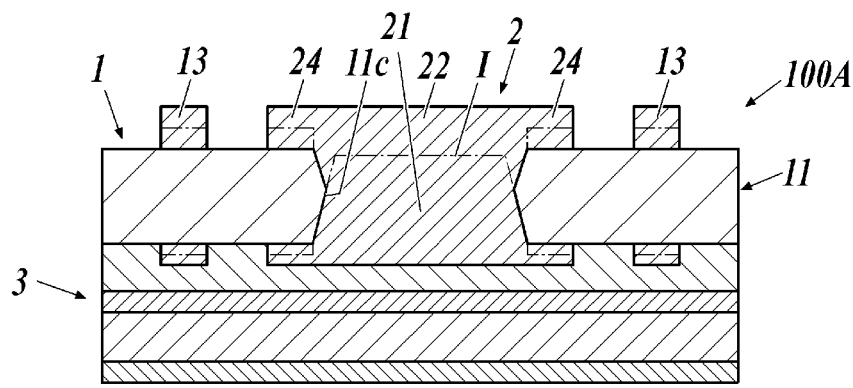
FIG. 4D shows one of the steps of the second half in manufacturing the printed wiring board according to the embodiment 1.

Thereafter, through the second filling step shown in FIG. 4C and the circuit forming step, as shown in FIG. 4D, the printed wiring board 100A of the embodiment 1 having the via drill hole 11c and the second filled portion 22 different in shape from those of the above embodiment is manufactured.

In the case of the above embodiment, the frustoconical interface I is formed by the second filled portion 22 and the first filled portion 21. Meanwhile, in the case of the embodiment 1, the frustoconical interface I lower than that of the above embodiment is formed by the second filled portion 22 and the first filled portion 21. However, the contour of the entire first filled portion 21 has a shape of a conical frustum that is similar to the interface I of the embodiment.

Laser beam machining is suitable for making a (mortar-shaped) hole(s) having a diameter that becomes smaller toward the depth. Hence, according to the embodiment 1, in addition to the effects described in the above embodiment, the following effect is obtained: the via drill hole 11c can be formed more easily, as compared with the above embodiment.

Another Embodiment 2

Unlike the above embodiment or embodiment 1, the diameter $d_b$ of the via drill hole 11c on the second surface 11b side may be smaller than the diameter $d_a$ thereof on the first surface 11a side.

For this case, there are a forming example 1 in which the diameter $d_b$ on the second surface 11b side is made smaller than the diameter $d_f$ of the upper base surface 11f of the via drill hole 11d and a forming example 2 in which the diameter $d_b$ on the second surface 11b side is made equal to the diameter $d_f$ of the upper base surface 11f.

Forming Example 1

A method of manufacturing a printed wiring board 100B in which the diameter $d_b$ of the via drill hole 11c on the second surface 11b side is smaller than the diameter $d_f$ of the upper base surface 11f of the via drill hole 11d is the same as that of the above embodiment to the substrate superposing step (shown in FIG. 3B).

Figure 5A:
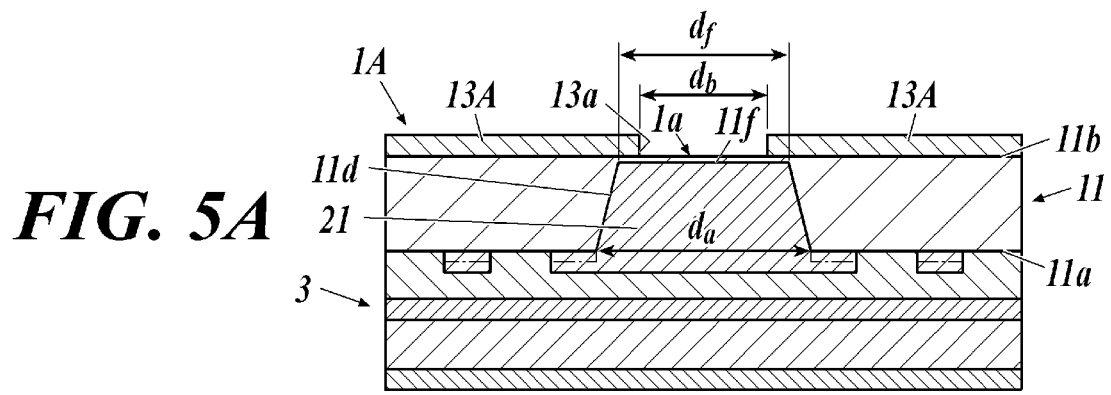
FIG. 5A shows one of steps of the second half in manufacturing a printed wiring board according to another embodiment 2.

In the subsequent opening forming step, as shown in FIG. 5A, the second opening 13a having the diameter $d_b$ smaller than the diameter $d_f$ of the upper base surface 11f of the via drill hole 11d is formed by the same method as that of the above embodiment, on the second copper foil layer 13A of the copper-clad laminate LA, at a point where the via 2 is to be formed.

The diameter $d_b$ of the second opening 13a is not less than the thickness of the via to be formed that can flow current of a predetermined magnitude.

In another embodiment 2, only part (the central portion, without the peripheral portion) of the bottom wall 1a of the first insulating layer 11 is exposed from the second opening 13a. Hence, in the subsequent bottom wall removing step, only part of the bottom wall 1a is removed.

Figure 5B:
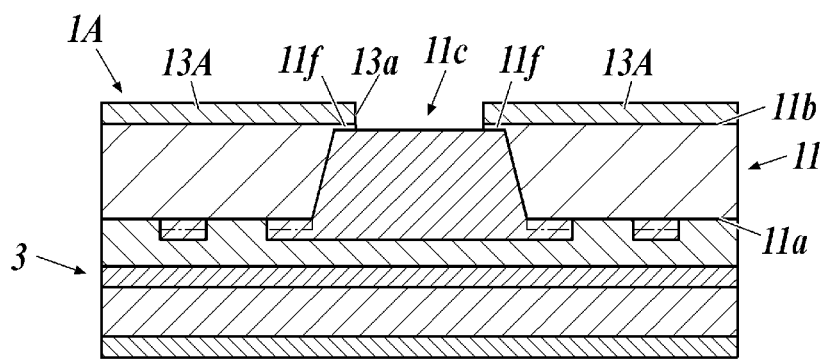
FIG. 5B shows one of the steps of the second half in manufacturing the printed wiring board according to the embodiment 2.

When part of the bottom wall 1a is removed, as shown in FIG. 5B, the via drill hole 11c is formed. The via drill hole 11c is shaped such that, on the upper base surface 11f of the frustoconical via drill hole 11d, a disc one size smaller than the upper base surface 11f is superposed.

Figure 5C:
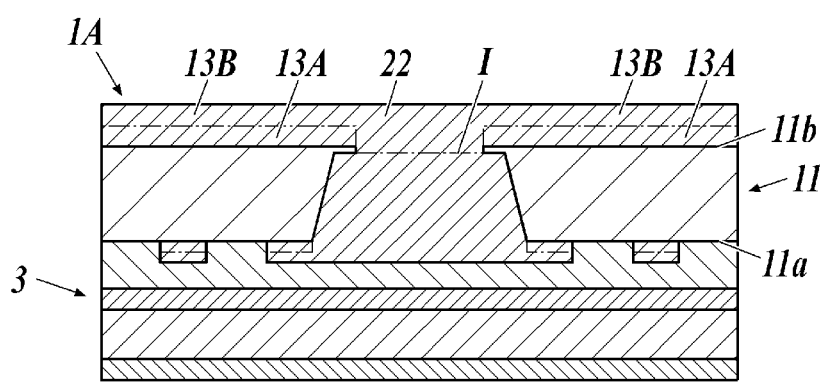
FIG. 5C shows one of the steps of the second half in manufacturing the printed wiring board according to the embodiment 2.
Figure 5D:
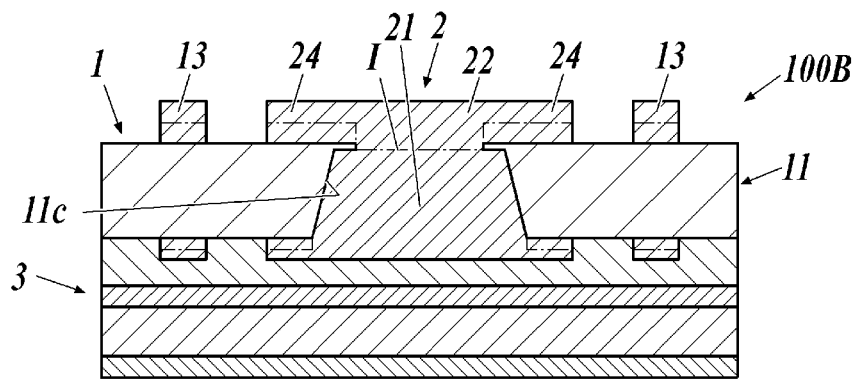
FIG. 5D shows one of the steps of the second half in manufacturing the printed wiring board according to the embodiment 2.

Thereafter, through the second filling step shown in FIG. 5C and the circuit forming step, as shown in FIG. 5D, the printed wiring board 100B of the embodiment 2 having the via drill hole 11c and the second filled portion 22 different in shape from those of the above embodiment or embodiment 1 is manufactured.

In the case of the embodiment 2, the planar interface I is formed by the second filled portion 22 and the first filled portion 21. However, the interface (the contour of the entire first filled portion 21) existing between (i) the second filled portion 22 and the first insulating layer 11 and (ii) the first filled portion 21 has a shape of a conical frustum that is similar to the interface I of the embodiment.

Forming Example 2

A method of manufacturing a printed wiring board 100C in which the diameter $d_b$ of the via drill hole 11c on the second surface 11b side is equal to the diameter $d_f$ of the upper base surface 11f of the via drill hole 11d is also the same as that of the above embodiment to the substrate superposing step (shown in FIG. 3B).

Figure 6A:
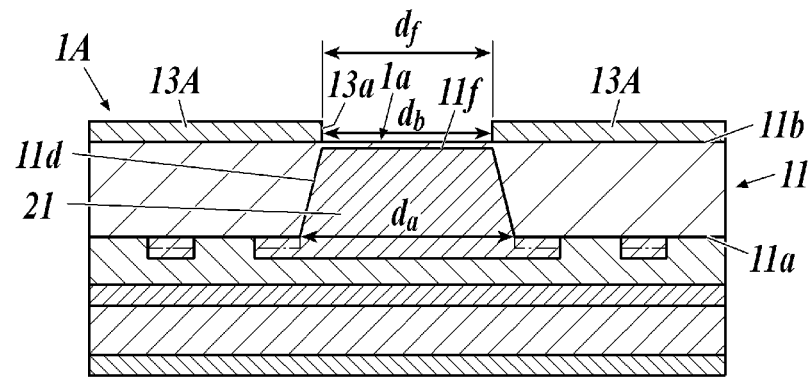
FIG. 6A shows one of steps of the second half in manufacturing a printed wiring board according to the embodiment 2.

In the subsequent opening forming step, as shown in FIG. 6A, the second opening 13a having the diameter $d_b$ equal to the diameter $d_f$ of the upper base surface 11f of the via drill hole 11d is formed by the same method as that of the above embodiment, on the second copper foil layer 13A of the copper-clad laminate LA, at a point where the via 2 is to be formed.

In the embodiment 2, only the entire bottom wall 1a of the first insulating layer 11 is exposed from the second opening 13a. Hence, in the subsequent bottom wall removing step, only the entire bottom wall 1a is removed.

Figure 6B:
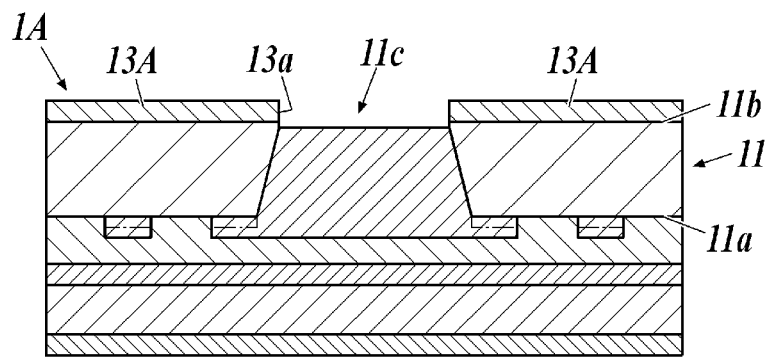
FIG. 6B shows one of the steps of the second half in manufacturing the printed wiring board according to the embodiment 2.

When the entire bottom wall 1a is removed, as shown in FIG. 6B, the via drill hole 11c is formed. The via drill hole 11c is shaped such that, on the upper base surface 11f of the frustoconical via drill hole 11d, a disc having the same diameter as the upper base surface 11f is superposed.

Figure 6C:
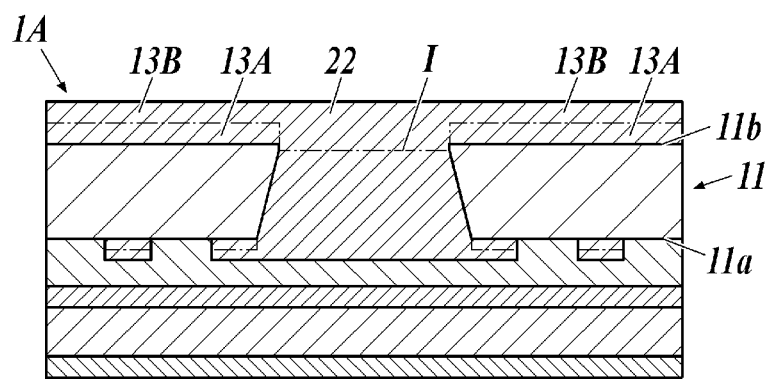
FIG. 6C shows one of the steps of the second half in manufacturing the printed wiring board according to the embodiment 2.
Figure 6D:
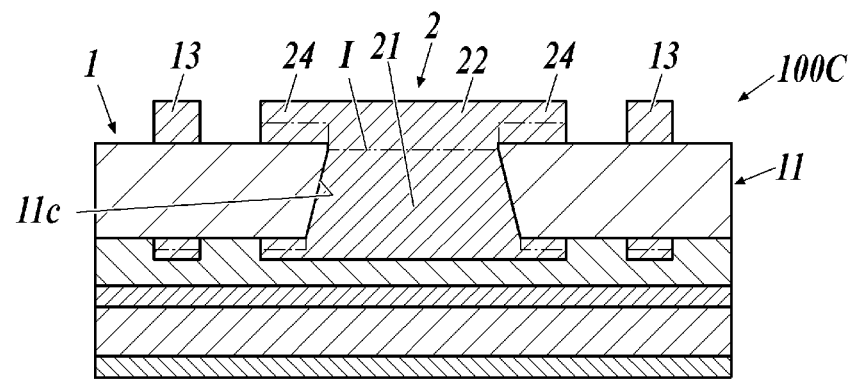
FIG. 6D shows one of the steps of the second half in manufacturing the printed wiring board according to the embodiment 2.

Thereafter, through the second filling step shown in FIG. 6C and the circuit forming step, as shown in FIG. 6D, the printed wiring board 100C of the embodiment 2 having the via drill hole 11c and the second filled portion 22 different in shape from those of the above embodiment, embodiment 1 or embodiment 2 is manufactured.

In the case of the forming example 2, as with the forming example 1, the planar interface I is formed by the second filled portion 22 and the first filled portion 21. However, the interface (the contour of the entire first filled portion 21) existing between (i) the second filled portion 22 and the first insulating layer 11 and (ii) the first filled portion 21 has a shape of a conical frustum that is similar to the interface I of the embodiment.

According to each one of the forming examples of the embodiment 2, the diameter $d_b$ of the second filled portion 22 of the via 2 is made small, so that the diameter of the second land 24 can be made small. Hence, according to the embodiment 2, in addition to the effects described in the above embodiment, the following effect is obtained: a space usable for forming the second wiring 13 becomes large, and accordingly the degree of freedom in designing the second wiring 13 is increased.

Another Embodiment 3

Unlike the above embodiment, embodiment 1 or embodiment 2, the diameter $d_b$ of the via drill hole 11c on the second surface 11b side may be larger than the diameter $d_a$ thereof on the first surface 11a side.

A method of manufacturing such a printed wiring board 100D is the same as that of the above embodiment to the substrate superposing step (shown in FIG. 3B).

Figure 7A:
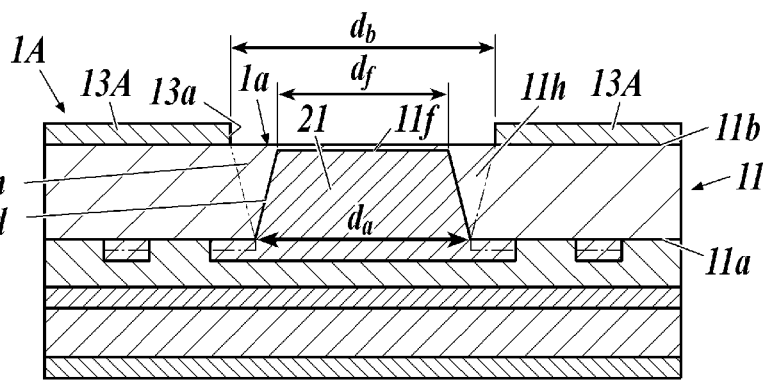
FIG. 7A shows one of steps of the second half in manufacturing a printed wiring board according to another embodiment 3.

In the subsequent opening forming step, as shown in FIG. 7A, the second opening 13a having the diameter $d_b$ larger than the diameter $d_f$ of the upper base surface 11f of the via drill hole 11d is formed by the same method as that of the above embodiment, on the second copper foil layer 13A of the copper-clad laminate 1A, at a point where the via 2 is to be formed.

In another embodiment 3, the diameter $d_b$ of the second opening 13a is larger than the diameter $d_a$ of the via drill hole 11d on the first surface 11a side. Hence, in the subsequent bottom wall removing step, the side wall 11h is removed in addition to the bottom wall 1a.

In this embodiment, laser irradiation is adjusted such that the cut surface of a portion to be removed becomes the conical surface 11i that is inclined at the predetermined angle $\theta_b$ so as to taper from the edge of the second opening 13a on the second surface 11b toward the first surface 11a.

Figure 7B:
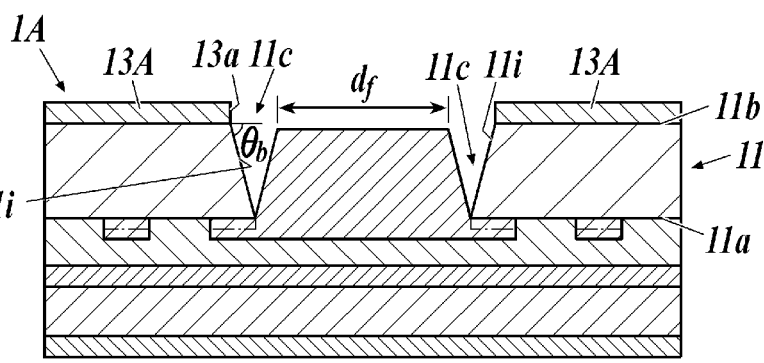
FIG. 7B shows one of the steps of the second half in manufacturing the printed wiring board according to the embodiment 3.

When the bottom wall 1a and the side wall 11h of the via drill hole 11d are removed, as shown in FIG. 7B, the frustoconical via drill hole 11c is formed, having the conical surface 11i that tapers from the second surface 11b toward the first surface 11a and is inclined at the predetermined angle $\theta_b$ with respect to the second surface 11b.

Figure 7C:
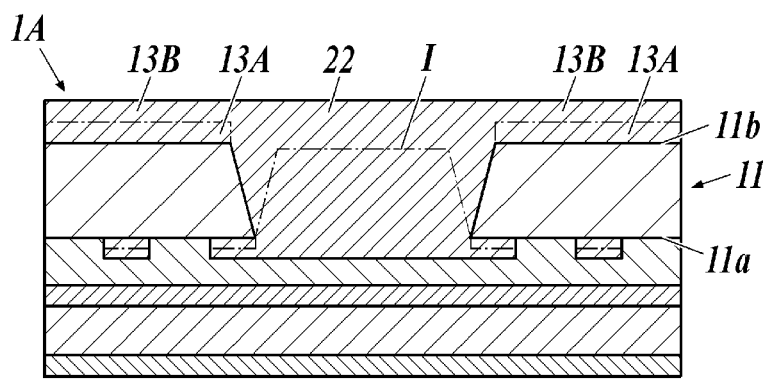
FIG. 7C shows one of the steps of the second half in manufacturing the printed wiring board according to the embodiment 3.
Figure 7D:
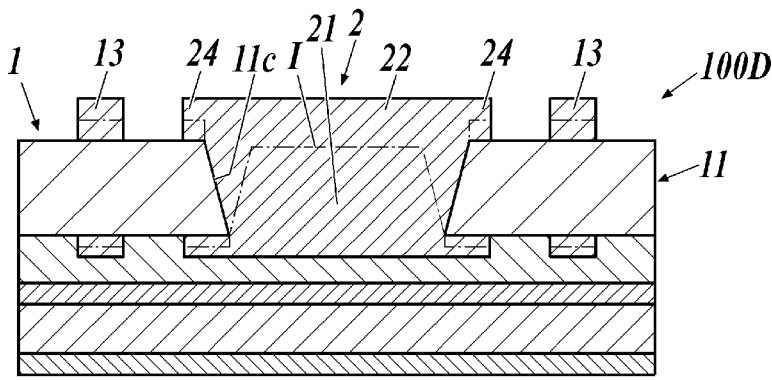
FIG. 7D shows one of the steps of the second half in manufacturing the printed wiring board according to the embodiment 3.

Thereafter, through the second filling step shown in FIG. 7C and the circuit forming step, as shown in FIG. 7D, the printed wiring board 100D of the embodiment 3 having the via drill hole 11c and the second filled portion 22 different in shape from those of the above embodiment, embodiment 1 or embodiment 2 is manufactured.

In the case of the embodiment 3, as with the above embodiment, the frustoconical interface I is formed by the second filled portion 22 and the first filled portion 21.

According to the embodiment 3, in addition to the effects described in the above embodiment, the following effect is obtained: the via 2 having a large diameter can be formed, and accordingly the reliability of conduction performance of the via 2 can be further enhanced.

INDUSTRIAL APPLICABILITY

The content of the present disclosure is applicable to a printed wiring board and a method of manufacturing a printed wiring board.

REFERENCE SIGNS LIST 100, 100A, 100B, 100C, 100D Printed Wiring Board
  1 First Substrate (Substrate)
    11 First Insulating Layer (Insulating Layer)
      11a First Surface
      11b Second Surface
      11c Via Drill Hole (Hole)

12 First Wiring
13 Second Wiring
1A Copper-clad Laminate
　1a Bottom Wall
　11A Insulating Layer
　　11d Via Drill Hole
　　11e Conical Surface
　　11f Upper Base Surface
　　11h Side Wall
　　11i Conical Surface
　12A First Copper Foil Layer
　　12a First Opening
　13A Second Copper Foil Layer
　　13a Second Opening
　13B Plating Layer
2 Via
　21 First Filled Portion
　　21a Conical Surface
　　21b Upper Base Surface
　22 Second Filled Portion
　23 First Land
　24 Second Land
3 Second Substrate
　31 Second Insulating Layer
　32 Third Wiring
4 Insulating Layer
　4p Prepreg
d Distance between Second Surface and Conical Surface
$d_a$ Diameter of Via Drill Hole on First Surface Side (Opening)
$d_b$ Diameter of Via Drill Hole on Second Surface Side (Opening)
$d_f$ Diameter of Upper Base Surface of Via Drill Hole (First Filled Portion)
I Interface
　$I_a$ Conical Surface
　$I_b$ Upper Base Surface
S Smear
$\theta_a$ Angle Formed by First Surface and Conical Surface
$\theta_b$ Angle Formed by Second Surface and Conical Surface
The invention claimed is:

1. A printed wiring board comprising:
a substrate including a planar insulating layer having a through hole in a thickness direction of the planar insulating layer; and
a via comprising a conductive material that fills the through hole, the via having a first filled portion of the conductive material in at least a central portion of the through hole, a second filled portion of the conductive material in a region of the through hole that is not filled by the first filled portion, and an interface between the second filled portion and the first filled portion, or between the second filled portion and the planar insulating layer,
wherein the first filled portion has a shape of a conical frustum having a conical surface that is inclined in the thickness direction so as to taper from a first surface of the planar insulating layer toward a second surface of the planar insulating layer that is opposite to the first surface,
wherein the first filled portion has an upper base surface that is parallel to the second surface and the conical surface,
wherein the second filled portion is in contact with the upper base surface and the conical surface of the first filled portion, and
wherein a first surface diameter of the through hole on the first surface is larger than a second surface diameter of the through hole on the second surface.

2. The printed wiring board according to claim 1, comprising a second substrate superposed on the first surface of the planar insulating surface.

3. The printed wiring board according to claim 2, wherein a material forming the planar insulating layer is different from a material forming an insulating layer of the second substrate.

4. The printed wiring board according to claim 3, wherein the planar insulating layer is made of polytetrafluoroethylene.

5. A method of manufacturing a printed wiring board using a copper-clad laminate including an insulating layer formed in a shape of a plate, comprising:
a hole forming step of forming, in a first surface of the insulating layer in a thickness direction of the insulating layer, a bottomed hole in a shape of a conical frustum having a conical surface that is inclined so as to taper from the first surface toward a second surface of the insulating layer that is opposite to the first surface, and having an upper base surface that is parallel to the second surface;
a first filling step of filling the bottomed hole with a conductive material, thereby forming a first filled portion;
a bottom wall removing step of removing, on the second surface, at least a bottom wall of the bottomed hole, thereby exposing the conductive material; and
a second filling step of filling, with the conductive material, a space formed after the bottom wall is removed, thereby forming a via.

6. The method of manufacturing a printed wiring board according to claim 5,
wherein in the hole forming step, smear is left on an inner surface of the formed bottomed hole, and
wherein in the bottom wall removing step, at least the bottom wall is removed by laser beam machining, and desmearing and soft etching are performed to remove the smear that remains after the bottom wall is removed.

7. The method of manufacturing a printed wiring board according to claim 5, comprising a substrate superposing step of superposing a second substrate on the first surface after the first filling step.

8. The method of manufacturing a printed wiring board according to claim 6, comprising a substrate superposing step of superposing a second substrate on the first surface after the first filling step.

* * * * *